(12) United States Patent
Yamazaki et al.

(10) Patent No.: US 10,249,626 B2
(45) Date of Patent: *Apr. 2, 2019

(54) SEMICONDUCTOR MEMORY DEVICE INCLUDING MULTILAYER WIRING LAYER

(71) Applicant: Semiconductor Energy Laboratory Co., Ltd., Atsugi-shi, Kanagawa-ken (JP)

(72) Inventors: Shunpei Yamazaki, Tokyo (JP); Yasuhiko Takemura, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/701,499

(22) Filed: Sep. 12, 2017

(65) Prior Publication Data

US 2017/0373068 A1 Dec. 28, 2017

Related U.S. Application Data

(63) Continuation of application No. 15/148,000, filed on May 6, 2016, now Pat. No. 9,786,668, which is a (Continued)

(30) Foreign Application Priority Data

Jan. 14, 2011 (JP) .................................. 2011-005401

(51) Int. Cl.
*G11C 11/24* (2006.01)
*H01L 27/108* (2006.01)
(Continued)

(52) U.S. Cl.
CPC .......... *H01L 27/10808* (2013.01); *G11C 5/10* (2013.01); *G11C 11/401* (2013.01);
(Continued)

(58) Field of Classification Search
CPC ................................................... G11C 11/4045
(Continued)

(56) References Cited

U.S. PATENT DOCUMENTS 5,424,235 A   6/1995   Nishihara
5,731,856 A   3/1998   Kim et al.
(Continued)

FOREIGN PATENT DOCUMENTS

EP   0475280 A   3/1992
EP   1737044 A   12/2006
(Continued)

OTHER PUBLICATIONS

Taiwanese Office Action (Application No. 107100365) dated Jun. 5, 2018.
(Continued)

*Primary Examiner* — Hoai V Ho
(74) *Attorney, Agent, or Firm* — Fish & Richardson P.C.

(57) ABSTRACT

The memory capacity of a DRAM is enhanced. A semiconductor memory device includes a driver circuit including part of a single crystal semiconductor substrate, a multilayer wiring layer provided over the driver circuit, and a memory cell array layer provided over the multilayer wiring layer. That is, the memory cell array overlaps with the driver circuit. Accordingly, the integration degree of the semiconductor memory device can be increased as compared to the case where a driver circuit and a memory cell array are provided in the same plane of a substrate containing a singe crystal semiconductor material.

24 Claims, 9 Drawing Sheets

Related U.S. Application Data continuation of application No. 14/336,118, filed on Jul. 21, 2014, now Pat. No. 9,337,345, which is a continuation of application No. 13/344,921, filed on Jan. 6, 2012, now Pat. No. 8,811,064.

(51) Int. Cl.

| | | |
|---|---|---|
| H01L 21/84 | (2006.01) | |
| H01L 27/06 | (2006.01) | |
| H01L 27/12 | (2006.01) | |
| H01L 49/02 | (2006.01) | |
| G11C 5/10 | (2006.01) | |
| G11C 11/401 | (2006.01) | |
| H01L 29/786 | (2006.01) | |
| G11C 11/408 | (2006.01) | |
| H01L 23/528 | (2006.01) | |
| H01L 23/532 | (2006.01) | |

(52) U.S. Cl.
CPC .......... *G11C 11/4085* (2013.01); *H01L 21/84* (2013.01); *H01L 23/528* (2013.01); *H01L 23/53228* (2013.01); *H01L 27/0688* (2013.01); *H01L 27/10805* (2013.01); *H01L 27/10873* (2013.01); *H01L 27/10882* (2013.01); *H01L 27/10897* (2013.01); *H01L 27/1207* (2013.01); *H01L 28/91* (2013.01); *H01L 29/7869* (2013.01)

(58) Field of Classification Search
USPC ........................................................ 365/149
See application file for complete search history.

(56) References Cited

U.S. PATENT DOCUMENTS

| | | |
|---|---|---|
| 5,744,864 A | 4/1998 | Cillessen et al. |
| 6,031,260 A | 2/2000 | Sunouchi |
| 6,127,702 A | 10/2000 | Yamazaki et al. |
| 6,140,667 A | 10/2000 | Yamazaki et al. |
| 6,160,271 A | 12/2000 | Yamazaki et al. |
| 6,258,650 B1 | 7/2001 | Sunouchi |
| 6,287,911 B1 | 9/2001 | Nobusawa |
| 6,294,274 B1 | 9/2001 | Kawazoe et al. |
| 6,433,376 B2 | 8/2002 | Kim |
| 6,563,174 B2 | 5/2003 | Kawasaki et al. |
| 6,605,508 B2 | 8/2003 | Kim |
| 6,608,324 B1 | 8/2003 | Yamazaki et al. |
| 6,727,522 B1 | 4/2004 | Kawasaki et al. |
| 6,855,956 B2 | 2/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,122,830 B2 | 10/2006 | Ishikawa et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,423,343 B2 | 9/2008 | Kurokawa |
| 7,453,065 B2 | 11/2008 | Saito et al. |
| 7,453,087 B2 | 11/2008 | Iwasaki |
| 7,462,862 B2 | 12/2008 | Hoffman et al. |
| 7,462,912 B2 | 12/2008 | Ahn et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 7,999,299 B2 | 8/2011 | Lee et al. |
| 8,193,533 B2 | 6/2012 | Yamazaki et al. |
| 8,202,365 B2 | 6/2012 | Umeda et al. |
| 8,222,092 B2 | 7/2012 | Yamazaki et al. |
| 8,232,551 B2 | 7/2012 | Kim et al. |
| 8,269,217 B2 | 9/2012 | Arai et al. |
| 8,362,565 B2 | 1/2013 | Kuroda |
| 8,368,067 B2 | 2/2013 | Uchiyama et al. |
| 8,378,341 B2 | 2/2013 | Hayashi et al. |
| 8,492,756 B2 | 7/2013 | Sakata et al. |
| 8,497,504 B2 | 7/2013 | Arai et al. |
| 8,748,878 B2 | 6/2014 | Yamaguchi et al. |
| 8,785,929 B2 | 7/2014 | Sakata et al. |
| 8,811,064 B2 | 8/2014 | Yamazaki et al. |
| 8,975,626 B2 | 3/2015 | Suzuki et al. |
| 9,040,985 B2 | 5/2015 | Sakata et al. |
| 9,129,937 B2 | 9/2015 | Hayashi et al. |
| 9,136,390 B2 | 9/2015 | Yamazaki et al. |
| 9,337,345 B2* | 5/2016 | Yamazaki ............... H01L 21/84 |
| 9,711,651 B2 | 7/2017 | Yamazaki et al. |
| 9,786,668 B2* | 10/2017 | Yamazaki ............... H01L 21/84 |
| 2001/0046027 A1 | 11/2001 | Tai et al. |
| 2002/0056838 A1 | 5/2002 | Ogawa |
| 2002/0101906 A1 | 8/2002 | Braun et al. |
| 2002/0132454 A1 | 9/2002 | Ohtsu et al. |
| 2003/0139027 A1 | 7/2003 | Ikeda et al. |
| 2003/0189401 A1 | 10/2003 | Kido et al. |
| 2003/0218222 A1 | 11/2003 | Wager, III et al. |
| 2003/0222302 A1 | 12/2003 | Saito et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0059236 A1 | 3/2005 | Nishida et al. |
| 2005/0199959 A1 | 9/2005 | Chiang et al. |
| 2005/0280061 A1 | 12/2005 | Lee |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0138463 A1 | 6/2006 | Kim et al. |
| 2006/0169973 A1 | 8/2006 | Isa et al. |
| 2006/0170111 A1 | 8/2006 | Isa et al. |
| 2006/0195729 A1 | 8/2006 | Huppenthal et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0095653 A1 | 5/2007 | Ohashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |

(56) References Cited

U.S. PATENT DOCUMENTS

| | | |
|---|---|---|
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0283873 A1 | 11/2008 | Yang et al. |
| 2008/0296568 A1 | 12/2008 | Ryu et al. |
| 2008/0308796 A1 | 12/2008 | Akimoto et al. |
| 2009/0008693 A1 | 1/2009 | Hachisuka et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0122595 A1 | 5/2009 | Takahashi et al. |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0152607 A1 | 6/2009 | Tanaka et al. |
| 2009/0168482 A1 | 7/2009 | Park et al. |
| 2009/0189153 A1 | 7/2009 | Iwasaki et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0070942 A1 | 3/2010 | Madurawe |
| 2010/0092800 A1 | 4/2010 | Itagaki et al. |
| 2010/0109002 A1 | 5/2010 | Itagaki et al. |
| 2010/0140710 A1 | 6/2010 | Kuroda |
| 2010/0148170 A1 | 6/2010 | Ueda et al. |
| 2010/0148171 A1 | 6/2010 | Hayashi et al. |
| 2010/0200843 A1 | 8/2010 | Arai et al. |
| 2010/0327407 A1 | 12/2010 | Kang |
| 2010/0330738 A1 | 12/2010 | Uchiyama et al. |
| 2011/0042677 A1 | 2/2011 | Suzuki et al. |
| 2011/0062433 A1 | 3/2011 | Yamazaki |
| 2011/0084267 A1 | 4/2011 | Yamazaki et al. |
| 2011/0101351 A1 | 5/2011 | Yamazaki |
| 2011/0121878 A1 | 5/2011 | Kato et al. |
| 2011/0122670 A1 | 5/2011 | Yamazaki et al. |
| 2011/0122673 A1 | 5/2011 | Kamata et al. |
| 2011/0127524 A1 | 6/2011 | Yamazaki et al. |
| 2011/0128777 A1 | 6/2011 | Yamazaki et al. |
| 2011/0134683 A1 | 6/2011 | Yamazaki et al. |
| 2011/0147737 A1 | 6/2011 | Yamazaki et al. |
| 2011/0156025 A1 | 6/2011 | Shionoiri et al. |
| 2011/0156027 A1 | 6/2011 | Yamazaki et al. |
| 2011/0156028 A1 | 6/2011 | Yamazaki et al. |
| 2011/0156117 A1 | 6/2011 | Yamazaki et al. |
| 2011/0157961 A1 | 6/2011 | Yamazaki et al. |
| 2011/0175081 A1 | 7/2011 | Goyal et al. |
| 2011/0187410 A1 | 8/2011 | Kato et al. |
| 2011/0210328 A1 | 9/2011 | Yamazaki et al. |
| 2011/0212571 A1 | 9/2011 | Yamazaki et al. |
| 2011/0215318 A1 | 9/2011 | Yamazaki et al. |
| 2012/0057396 A1 | 3/2012 | Yamazaki et al. |
| 2012/0063208 A1 | 3/2012 | Koyama et al. |
| 2012/0063209 A1 | 3/2012 | Koyama et al. |
| 2012/0075917 A1 | 3/2012 | Takemura |
| 2012/0081948 A1 | 4/2012 | Takemura |
| 2012/0112257 A1 | 5/2012 | Kato |
| 2015/0287832 A1 | 10/2015 | Hayashi et al. |
| 2017/0317215 A1 | 11/2017 | Yamazaki et al. |

FOREIGN PATENT DOCUMENTS

| | | | |
|---|---|---|---|
| EP | 2146379 A | 1/2010 | |
| EP | 2226847 A | 9/2010 | |
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 04-225276 A | 8/1992 | |
| JP | 05-251705 A | 9/1993 | |
| JP | 08-264794 A | 10/1996 | |
| JP | 09-082918 A | 3/1997 | |
| JP | 11-505377 | 5/1999 | |
| JP | 2000-044236 A | 2/2000 | |
| JP | 2000-150900 A | 5/2000 | |
| JP | 2001-196552 A | 7/2001 | |
| JP | 2001-223344 A | 8/2001 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2006-261178 A | 9/2006 | |
| JP | 2007-096055 A | 4/2007 | |
| JP | 2007-123861 A | 5/2007 | |
| JP | 2007-220820 A | 8/2007 | |
| JP | 2009-152235 A | 7/2009 | |
| JP | 2009-167087 A | 7/2009 | |
| JP | 2010-021555 A | 1/2010 | |
| JP | 2010-118407 A | 5/2010 | |
| JP | 2010-135585 A | 6/2010 | |
| JP | 2010-140919 A | 6/2010 | |
| JP | 2010-141230 A | 6/2010 | |
| JP | 2010-157756 A | 7/2010 | |
| JP | 2010-171404 A | 8/2010 | |
| JP | 2010-183027 A | 8/2010 | |
| JP | 2010-192881 A | 9/2010 | |
| JP | 2010-248547 A | 11/2010 | |
| KR | 2006-0134579 A | 12/2006 | |
| KR | 2010-0091108 A | 8/2010 | |
| KR | 2010-0100603 A | 9/2010 | |
| TW | 408475 | 10/2000 | |
| TW | 455918 | 9/2001 | |
| WO | WO-2004/114391 | 12/2004 | |
| WO | WO-2010/058541 | 5/2010 | |

OTHER PUBLICATIONS

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

(56) References Cited

OTHER PUBLICATIONS

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaOS(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02: Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06: Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07: SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07: SID International Symposium Digest of Technical Papers, 2007, vol. 38, pp. 1737-1740.

Miyasaka.M, "SUFTLA Flexible Microelectronics on Their Way to Business", SID Digest '07: SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08: SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08: SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.

Sakata.J et al., "Development of 4.0-in. AMOLED Display With Driver Circuit Using Amorphous In—Ga—Zn-Oxide TFTs", IDW '09: Proceedings of the 16th International Display Workshops, 2009, pp. 689-692.

Asaoka.Y et al., "29.1:Polarizer-Free Reflective LCD Combined With Ultra Low-Power Driving Technglogy", SID Digest '09: SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09: SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09: SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09: SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09: SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09: SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09: SID International Symposium Digest of Technical Papers, May 31, 2009, vol. 40, pp. 184-187.

Ohara.H et al., "21.3:4.0 in. QVGA AMOLED Display Using In—Ga—Zn-Oxide TFTs With a Novel Passivation Layer", SID Digest '09: SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09: SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", Nirim Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

(56) References Cited

OTHER PUBLICATIONS

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08: SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08: SID International Symposium Digest of Technical Papers, May 20, 2008, vol. 39, pp. 633-636.

Park.S et al., "42.3: Transparent ZnO Thin Film Transistor for the Application of High Aperture Ratio Bottom Emission AM-OLED Display", SID Digest '08: SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Korean Office Action (Application No. 2012-0003743) dated Mar. 13, 2015.

Korean Office Action (Application No. 2012-0003743) dated Jul. 13, 2015.

Korean Office Action (Application No. 2012-0003743) dated Jan. 11, 2016.

Taiwanese Office Action (Application No. 104113266) dated May 5, 2016.

\* cited by examiner

SEMICONDUCTOR MEMORY DEVICE INCLUDING MULTILAYER WIRING LAYER

CROSS-REFERENCE TO RELATED APPLICATIONS

This application is a continuation of U.S. application Ser. No. 15/148,000, filed May 6, 2016, now allowed, which is a continuation of U.S. application Ser. No. 14/336,118, filed Jul. 21, 2014, now U.S. Pat. No. 9,337,345, which is a continuation of U.S. application Ser. No. 13/344,921, filed Jan. 6, 2012, now U.S. Pat. No. 8,811,064, which claims the benefit of a foreign priority application filed in Japan as Serial No. 2011-005401 on Jan. 14, 2011, all of which are incorporated by reference.

BACKGROUND OF THE INVENTION

1. Field of the Invention

The present invention relates to semiconductor memory devices. In particular, one embodiment of the present invention relates to a semiconductor memory device including a memory cell including a transistor whose channel region is formed of an oxide semiconductor.

2. Description of the Related Art

In recent years, a metal oxide having semiconductor characteristics, which is called an oxide semiconductor exhibiting a high mobility and uniform element characteristics, has attracted attention as a material of a transistor. Metal oxides are used for a variety of applications. For example, indium oxide is used as a material of a pixel electrode in a liquid crystal display device, Examples of such a metal oxide having semiconductor characteristics include tungsten oxide, tin oxide, indium oxide, and zinc oxide; transistors which include such a metal oxide having semiconductor characteristics in their channel regions are known (Patent Documents 1 and 2).

REFERENCE

Patent Document 1: Japanese Published Patent Application No. 2007-123861
Patent Document 2: Japanese Published Patent Application No. 2007-096055

SUMMARY OF THE INVENTION

As semiconductor memory devices, there are volatile memories such as a DRAM and an SRAM and nonvolatile memories such as a mask ROM, an EPROM, an EEPROM, a flash memory, and a ferroelectric memory, most of which has already been put into practical use with the use of a single crystal semiconductor substrate. Among the above-described memory devices, a DRAM has a simple structure in which a memory cell consists of a transistor and a capacitor, and the number of semiconductor elements in the memory cell of the DRAM is fewer than that of semiconductor elements in other memory devices such as an SRAM. Therefore, the memory capacity per unit area can be increased as compared to other memory devices, resulting in lower cost.

A DRAM is suitable for large memory capacity as described above, nonetheless, it is necessary to increase the memory capacity per unit area as in other memory devices in order to improve the integration degree of an integrated circuit while suppressing an increase in chip size. Therefore, it is necessary to reduce the area of a capacitor for holding charge in each memory cell to reduce the area of each memory cell.

Specifically, for a reduction in the area of each memory cell, a technique of providing a capacitor in a deep groove formed in a semiconductor substrate (the capacitor is called a trench capacitor), a technique of providing a long capacitor directly above or substantially directly above a semiconductor substrate (the capacitor is called a stack capacitor), and the like have been developed. Specifically, capacitors with aspect ratios of higher than or equal to 50 have been developed. Further, a technique of providing a plurality of layered wiring layers over such a semiconductor substrate to electrically connect a significant amount of highly integrated semiconductor elements provided for the semiconductor substrate (the technique is called a multilayer wiring technique), and the like have been developed.

One object of one embodiment of the present invention is to enhance the memory capacity of a DRAM.

In a semiconductor memory device according to one embodiment of the present invention, a memory cell array is provided over a driver circuit including part of a substrate containing a single crystal semiconductor material with a multilayer wiring layer provided therebetween.

Specifically, one embodiment of the present invention is a semiconductor memory device including: a driver circuit including part of a single crystal semiconductor substrate; a multilayer wiring layer which is provided over the driver circuit and includes a plurality of wirings formed of copper or a copper alloy; and a memory cell array layer which is provided over the multilayer wiring layer and includes a plurality of memory cells arranged in a matrix manner. The plurality of memory cells are electrically connected to the driver circuit through respective at least ones of the plurality of wirings. Each memory cell includes a transistor whose channel region is formed of an oxide semiconductor and a capacitor whose one electrode is electrically connected to one of a source and a drain of the transistor.

In a semiconductor memory device according to one embodiment of the present invention, a memory cell array can be provided to overlap with a driver circuit including part of a substrate containing a single crystal semiconductor material. Accordingly, the integration degree of the semiconductor memory device can be increased as compared to the case where a driver circuit and a memory cell array are provided in the same plane of a substrate containing a single crystal semiconductor material.

DETAILED DESCRIPTION OF THE INVENTION

Embodiments of the present invention are hereinafter described with reference to the accompanying drawings. The present invention is not limited to the description below, and it is easily understood for those skilled in the art that a variety of modifications can be made without departing from the spirit and scope of the present invention. Therefore, the present invention is not construed as being limited to the content of the embodiments described hereinafter.

First, an example of a structure of a semiconductor memory device according; one embodiment of the present invention is described using FIGS. 1, 2, 3A to 3H, 4, 5A to 5H, 6, and 7A to 7H.

<Structure Example of Semiconductor Memory Device>

Figure 1:
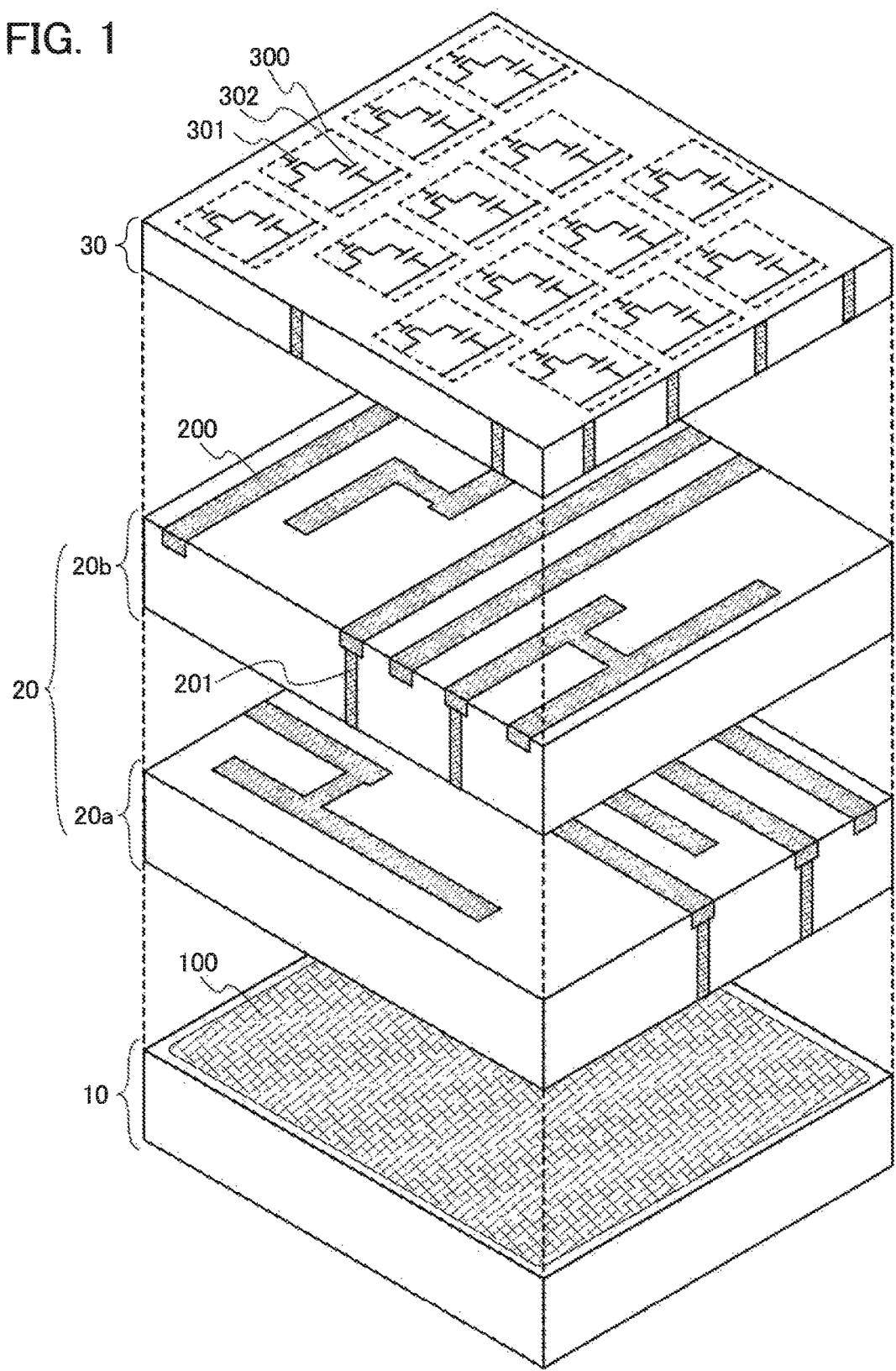
FIG. 1 illustrates a structure example of a semiconductor memory device.

FIG. 1 illustrates an example of a structure of a semiconductor memory device. The semiconductor memory device shown in FIG. 1 includes a driver circuit 100 including part of a substrate 10 containing a single crystal semiconductor material, a multilayer wiring layer 20 provided over the driver circuit 100, and a memory cell array layer 30 which is provided over the multilayer wiring layer 20 and includes a plurality of memory cells 300 arranged in a matrix manner.

The driver circuit 100 consists of a plurality of semiconductor elements using the substrate 10 containing a single crystal semiconductor material. With the driver circuit 100, data is written and read into/from each memory cell 300.

The multilayer wiring layer 20 includes a plurality of wiring layers 20a and 20b each having a plane with a plurality of wirings 200 provided. With the multilayer wiring layer 20, the semiconductor elements in the driver circuit 100 are electrically connected to each other, and the driver circuit 100 is electrically connected to each of the plurality of memory cells 300. The planes with the plurality of wirings 200 provided are layered in the multilayer wiring layer 20. Specifically, a plurality of insulating layers in each of which the plurality of wirings 200 are embedded are stacked. The plurality of wirings 200 in one plane are electrically connected to the plurality of wirings 200 in another plane through a contact plug 201 formed in the insulating layer. Although the multilayer wiring layer 20 consists of the two wiring layers 20a and 20b in FIG. 1, the multilayer wiring layer 20 according to one embodiment of the present invention is not limited to two layers: the multilayer wiring layer 20 may consist of three or more layers. Further, a bit line of the memory cell may be formed of one or more layers of the multilayer wiring layer 20.

Each memory cell 300 includes a transistor 301 and a capacitor 302 whose one electrode is electrically connected to one of a source and a drain of the transistor 301.

<Structure Example of Driver Circuit 100>

Hereinafter, an example of a transistor formed using the substrate 10 containing a single crystal semiconductor material in the driver circuit 100 is described using FIG. 2.

Figure 2:
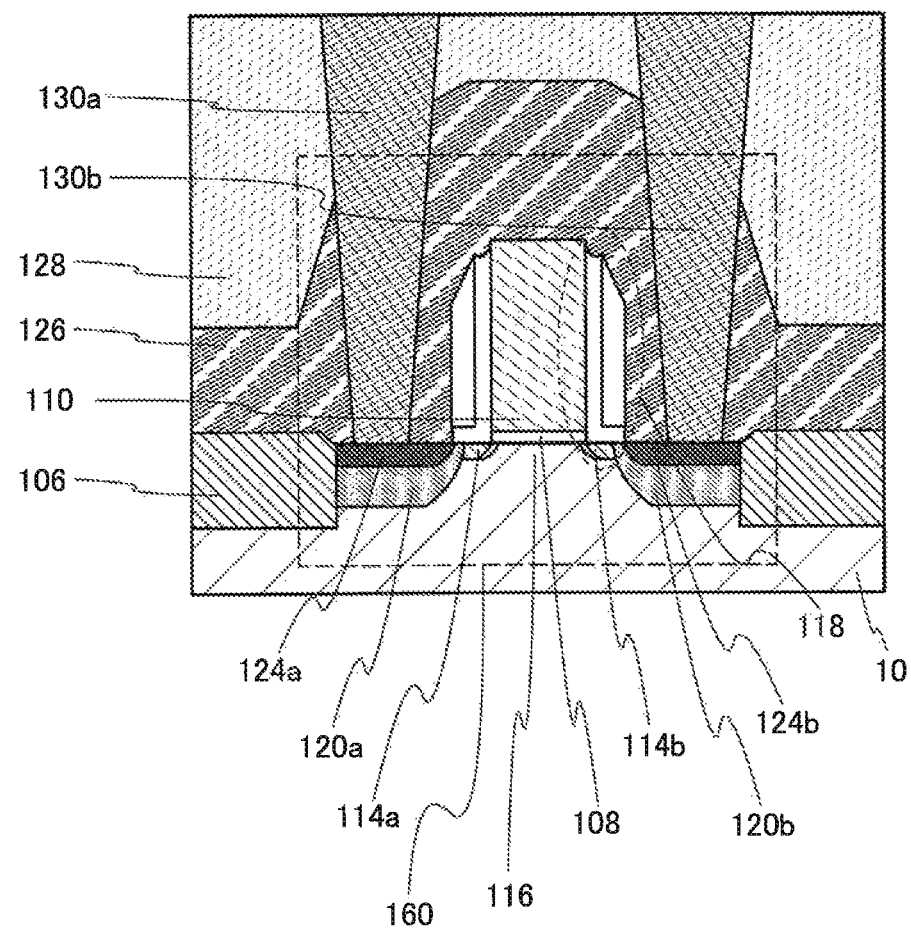
FIG. 2 illustrates a structure example of a transistor in a driver circuit.

A transistor 160 illustrated in FIG. 2 includes a channel region 116 provided in the substrate 10, a pair of impurity regions 114a and 114b and a pair of high concentration impurity regions 120a and 120b (these regions are also collectively referred to simply as impurity regions) each pair of which is provided with the channel region 116 provided therebetween, a gate insulating film 108 provided over the channel region 116, a gate electrode 110 provided over the gate insulating film 108, a source electrode 130a which is electrically connected to the impurity region 114a, and a drain electrode 130b which is electrically connected to the impurity region 114b.

A sidewall insulating layer 118 is provided on a side surface of the gate electrode 110. The substrate 10 includes the pair of high concentration impurity regions 120a and 120b in regions which do not overlap with the sidewall insulating layer 118, and includes a pair of metal compound regions 124a and 124b over the pair of high concentration impurity regions 120a and 120b. Further, an element isolation insulating layer 106 is provided over the substrate 10 so as to surround the transistor 160. An interlayer insulating layer 126 and an interlayer insulating layer 128 are provided so as to cover the transistor 160. The source electrode 130a is electrically connected to the metal compound region 124a through an opening formed in the interlayer insulating layers 126 and 128, and the drain electrode 130b is electrically connected to the metal compound region 124b through an opening formed in the interlayer insulating layers 126 and 128. In other words, the source electrode 130a is electrically connected to the high concentration impurity region 120a and the impurity region 114a through the metal compound region 124a, and the drain electrode 130b is electrically connected to the high concentration impurity region 120b and the impurity region 114b through the metal compound region 124b.

<Example of Manufacturing Method of Transistor>

Next, an example of a method for manufacturing the transistor 160 is described using FIGS. 3A to 3H. The transistor 160 can be formed not only by the following method but also any known method.

Figure 3A:
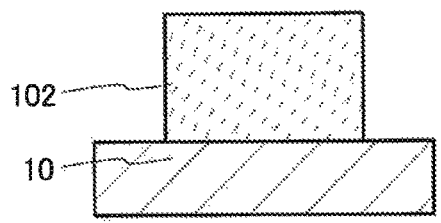
FIGS. 3A to 3H illustrate an example of a method for manufacturing a transistor.
Figure 3E:
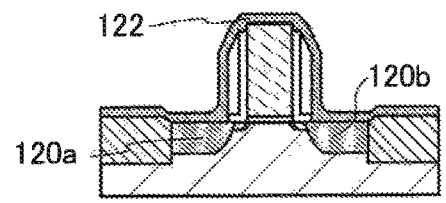

First, the substrate 10 containing a single crystal semiconductor material is prepared (see FIG. 3A). As the substrate 10, a single crystal semiconductor substrate of silicon, silicon carbide, silicon germanium, or gallium arsenide, an SOI substrate in which a single crystal layer thereof is provided on an insulating layer, or the like can be used. Note that although in general, the "SOI substrate" means a substrate in which a silicon semiconductor layer is provided on an insulating surface, the "SOI substrate" in this specification and the like also includes in its category a substrate in which a semiconductor layer containing a material other than silicon is provided on an insulating surface. That is, the semiconductor layer included in the "SOI substrate" is not limited to a silicon semiconductor layer. Further, the "SOI substrate" includes in its category a structure in which a semiconductor layer is provided over an insulating substrate such as a glass substrate with an insulating layer provided therebetween. An example of the case where a single crystal silicon substrate is used as the substrate 10 is described herein.

A protective layer 102 serving as a mask for forming an element isolation insulating layer is formed over the substrate 10 (see FIG. 3A). As the protective layer 102, an insulating layer formed using silicon oxide, silicon nitride, silicon nitride oxide, or the like can be used, for example. Before or after this step, an impurity element imparting an n-type conductivity or an impurity element imparting a p-type conductivity may be added to the substrate 10 in order to control the threshold voltage of a semiconductor device. When the semiconductor of the substrate 10 is silicon, phosphorus, arsenic, or the like can be used as the impurity imparting the n-type conductivity, and boron, aluminum, gallium, or the like can be used as the impurity imparting the p-type conductivity Next, part of the substrate 10 in a region (an exposed region) which is not covered with the protective layer 102 is etched using the protective layer 102 as a mask. Thus, an isolated semiconductor region 104 is formed (see FIG. 3B). As the etching, dry etching is preferably employed, but wet etching can alternatively be employed. An etching gas or an etchant thereof can be selected as appropriate depending on the material to be etched.

Figure 3B:
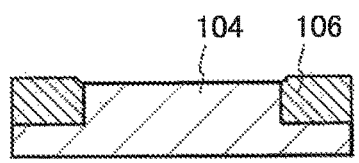

Next, an insulating layer is formed so as to cover the semiconductor region 104 and is selectively removed in a region overlapping with the semiconductor region 104, so that the element isolation insulating layers 106 are formed (see FIG. 3B). The insulating layer is formed using silicon oxide, silicon nitride, silicon nitride oxide, or the like. As a method for removing the insulating layer, polishing treatment such as chemical mechanical polishing (CMP), etching treatment, or the like can be given, and any of the treatments can be employed. The protective layer 102 is removed after formation of the semiconductor region 104 or after formation of the element isolation insulating layers 106.

Next, an insulating layer is formed over the semiconductor region 104, and a layer containing a conductive material is formed over the insulating layer.

The insulating layer serves as a gate insulating film and preferably has a single-layer structure or a stacked-layer structure using a film containing silicon oxide, silicon nitride oxide, silicon nitride, hafnium oxide, aluminum oxide, tantalum oxide, or the like which is formed by a CVD method, a sputtering method, or the like. Alternatively, the insulating layer may be formed by oxidizing or nitriding a surface of the semiconductor region 104 by high-density plasma treatment or thermal oxidation treatment. The high-density plasma treatment can be performed with, for example, a mixed gas of a rare gas such as He, Ar, Kr, or Xe and oxygen, nitrogen oxide, ammonia, nitrogen, or the like. The permittivity and thickness of the insulating layer are determined depending on the channel length of the transistor; for example, the thickness of the insulating layer may be greater than or equal to 1 nm and less than or equal to 100 nm.

The layer containing a conductive material can be formed using a metal material such as aluminum, copper, titanium, tantalum, or tungsten. The layer containing a conductive material may be formed using a semiconductor material such as polycrystalline silicon exhibiting high conductivity. There is no particular limitation on the method for forming the layer containing a conductive material; any film formation method such as an evaporation method, a CVD method, a sputtering method, or a spin coating method can be employed. An example of the case where the layer containing a conductive material is formed using a metal material is described herein.

Figure 3F:
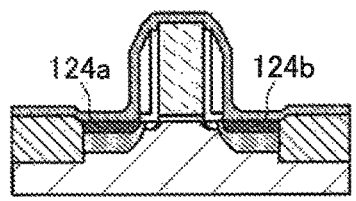
Figure 3C:
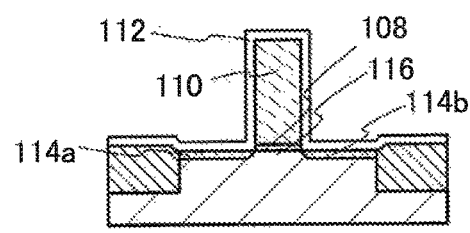

After that, the insulating layer and the layer containing a conductive material are selectively etched, so that the gate insulating film 108 and the gate electrode 110 are formed (see FIG. 3C).

Next, an insulating layer 112 that covers the gate electrode 110 is formed (see FIG. 3C). Then, boron (B), phosphorus (P), arsenic (As), or the like is added to the semiconductor region 104, so that the pair of impurity regions 114a and 114b with a shallow junction is formed (see FIG. 3C). By formation of the pair of impurity regions 114a and 114b, the channel region 116 is formed in the semiconductor region 104 below the gate insulating film 108 (see FIG. 3C). The concentration of the impurity added can be set as appropriate; the concentration is preferably set to be high when the size of a semiconductor element is extremely decreased. Although the pair of impurity regions 114a and 114b is formed after formation of the insulating layer 112 in this example, the insulating layer 112 may be formed after formation of the pair of impurity regions 114a and 114b.

Figure 3G:
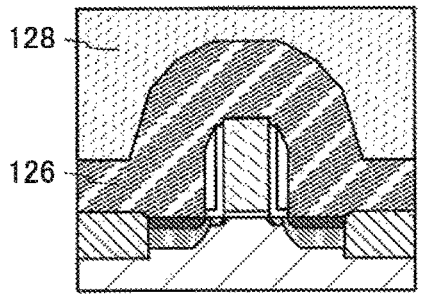
Figure 3D:
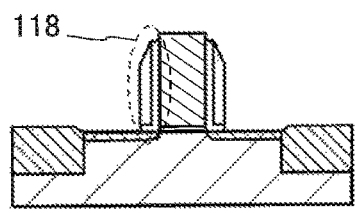

Next, the sidewall insulating layer 118 is formed (see FIG. 3D). An insulating layer is formed so as to cover the insulating layer 112 and then subjected to highly anisotropic etching, thereby forming the sidewall insulating layer 118 in a self-aligned manner. In this step, the insulating layer 112 may be partly etched to expose a top surface of the gate electrode 110 and part of top surfaces of the impurity regions 114a and 114b.

Next, an insulating layer is formed to cover the gate electrode 110, the pair of impurity regions 114a and 114b, the sidewall insulating layer 118, and the like. Then, boron (B), phosphorus (P), arsenic (As), or the like is added to part of the impurity regions 114a and 114b, so that the pair of high concentration impurity regions 120a and 120b is formed (see FIG. 3E). If necessary, an impurity imparting the opposite conductivity type may be added to the outer side of the high concentration impurity region 120a, 120b to form a halo region. After that, the insulating layer is removed, and a metal layer 122 is formed to cover the gate electrode 110, the sidewall insulating layer 118, the pair of high concentration impurity regions 120a and 120b, and the like (see FIG. 3E). The metal layer 122 can be formed by any film formation method such as a vacuum deposition method, a sputtering method, or a spin coating method. The metal layer 122 is preferably formed using a metal material that reacts with the semiconductor material of the semiconductor region 104 to be a low-resistance metal compound. Examples of such a metal material are titanium, tantalum, tungsten, nickel, cobalt, and platinum.

Next, heat treatment is performed thereon to react the metal layer 122 with the semiconductor material, so that the pair of metal compound regions 124a and 124b in contact with the pair of high concentration impurity regions 120a and 120b, respectively is formed (see FIG. 3F). When the gate electrode 110 is formed using polycrystalline silicon or the like, a metal compound region is also formed in a region of the gate electrode 110 in contact with the metal layer 122.

As the heat treatment, irradiation with a flash lamp can be employed, for example. Although it is needless to say that any another heat treatment may be employed, a method by which heat treatment for a time as short as possible can be achieved is preferably used in order to improve the controllability of chemical reaction in formation of the metal compound. The metal compound regions are formed by reaction of the metal material and the semiconductor material and have sufficiently high conductivity. With the metal compound regions, the electric resistance can be sufficiently reduced and the element characteristics can be improved. The metal layer 122 is removed after formation of the pair of metal compound regions 124a and 124b.

Next, the interlayer insulating layer 126 and the interlayer insulating layer 128 are formed thereon (see FIG. 3G). The interlayer insulating layers 126 and 128 can be formed using an inorganic insulating material such as silicon oxide, silicon nitride oxide, silicon nitride, hafnium oxide, aluminum oxide, or tantalum oxide. The interlayer insulating layers 126 and 128 can also be formed using an organic insulating material such as polyimide or acrylic. A two-layer structure of the interlayer insulating layer 126 and the interlayer insulating layer 128 is employed in this example; however, the structure of an interlayer insulating layer in one embodiment of the present invention is not limited thereto. After formation of the interlayer insulating layer 128, a top surface of the interlayer insulating layer 128 is preferably planarized with CMP, etching treatment, or the like.

Figure 3H:
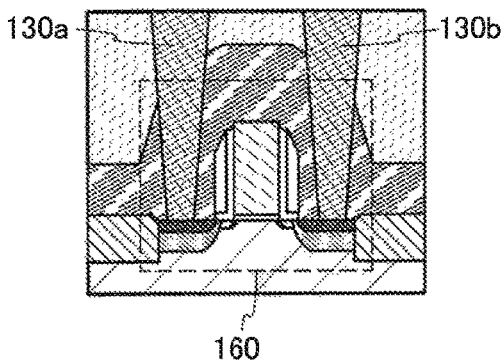

Then, openings that reach the pair of metal compound regions 124a and 124b are formed in the interlayer insulating layers, and the source electrode 130a and the drain electrode 130b are formed in the openings (see FIG. 3H). A conductive layer is formed by a PVD method, a CVD method, or the like in a region including the openings, and part of the conductive layer is removed by etching treatment, CMP, or the like, thereby forming the source electrode 130a and the drain electrode 130b.

It is preferable that top surfaces of the source electrode 130a and the drain electrode 130b be planar. For example, in the case where a thin titanium film or a thin titanium nitride film is formed in the region including the openings and then a tungsten film is formed to be embedded in the openings, part of tungsten, titanium, titanium nitride, or the like can be removed as appropriately and the planarity of a top surface thereof can be improved by CMP. By planarizing the top surface including the source electrode 130a and the top surface of the drain electrode 130b in this manner, an electrode, a wiring, an insulating layer, a semiconductor layer, and the like can be formed in later steps more appropriately.

Through the above, the transistor 160 using the substrate 10 containing a single crystal semiconductor material is formed.

<Structure Example of Wiring Layer 20a, 20b>

An example of a structure of the wiring layer 20a, 20b is described below using FIG. 4.

Figure 4:
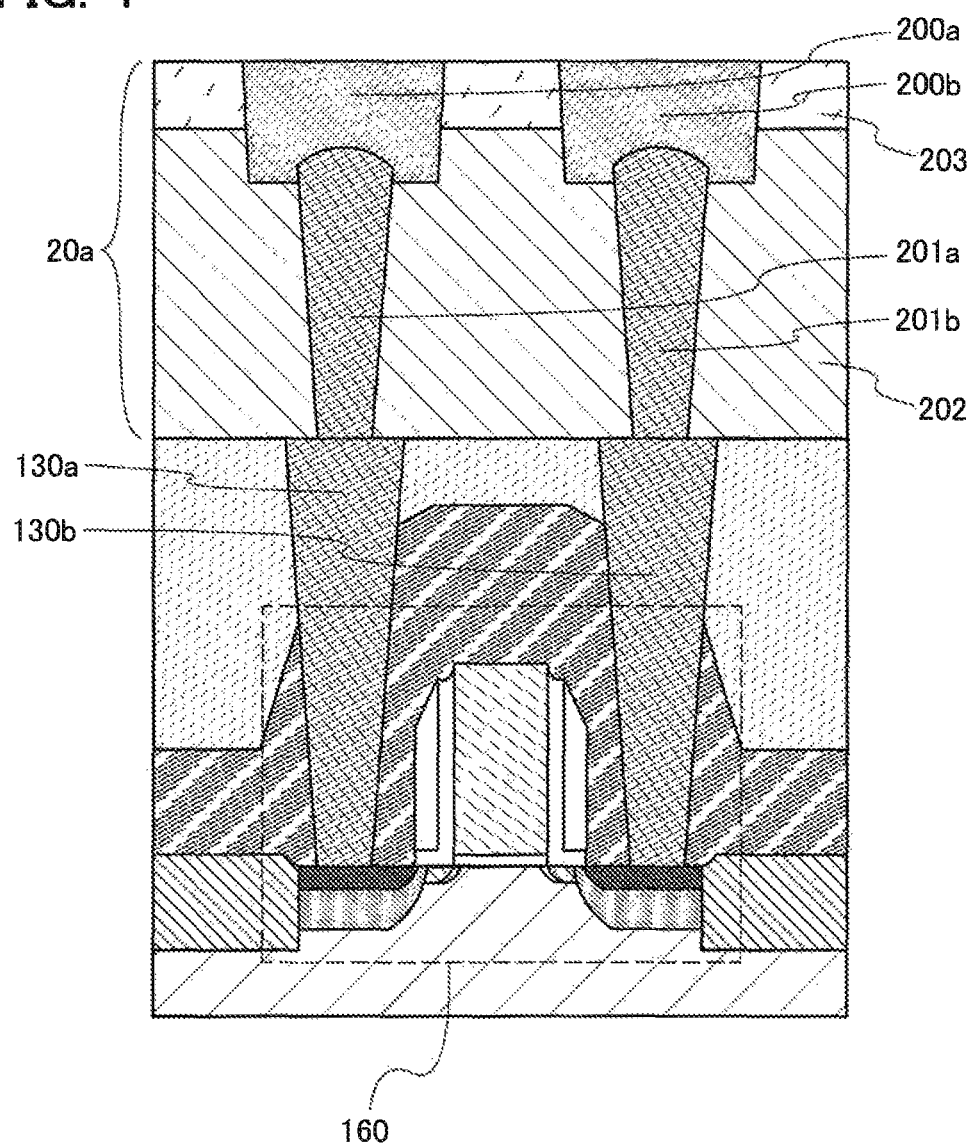
FIG. 4 illustrates a structure example of a wiring layer.

The wiring layer 20a shown in FIG. 4 includes an insulating layer 202, contact plugs 201a and 201b provided in openings of the insulating layer 202, an insulating layer 203 provided over the insulating layer 202, and wirings 200a and 200b provided in openings of the insulating layer 203. The wiring layer 20b has the same structure as the wiring layer 20a.

The insulating layer 202 is provided over the transistor 160 shown in FIG. 2. The contact plug 201a is connected to the source electrode 130a of the transistor 160 and the wiring 200a, and the contact plug 201b is connected to the drain. electrode 130b of the transistor 160 and the wiring 200b.

<Example of Manufacturing Method of Wiring Layer 20a, 20b>

Next, an example of a method for manufacturing the wiring layer 20a, 20b is described using FIGS. 5A to 5H.

Figure 5A:
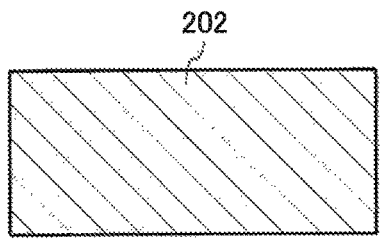
FIGS. 5A to 5H illustrate an example of a method for manufacturing a wiring layer.

First, the insulating layer 202 is formed over the transistor 160 (see FIG. 5A, though the transistor 160 is not shown). The insulating layer 202 can have a single-layer structure or a stacked-layer structure using a film containing an inorganic insulating material such as silicon oxide, silicon nitride oxide, or silicon nitride. For example, a stacked layer of a silicon nitride film and a silicon oxide film can be used as the insulating layer 202. In particular, in the case where the wirings 200a and 200b contain copper, it is preferable to use a stacked-layer structure in which a silicon nitride film with a thickness greater than or equal to 5 nm and less than or equal to 50 nm is formed and a silicon oxide film with an appropriate thickness is stacked thereon in order to prevent dispersion of copper to the transistor 160. As a method for forming the insulating layer 202, a CVD method, a sputtering method, or the like can be employed.

Figure 5B:
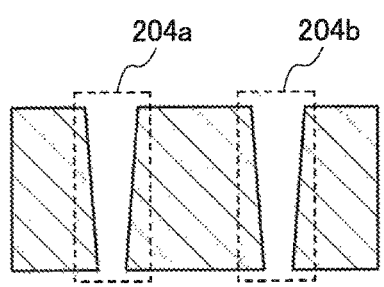

Next, a resist mask is formed over the insulating layer 202. by a photolithography method or the like, and the insulating layer 202 is etched using the resist mask, so that openings 204a and 204b are formed (see FIG. 5B). In the case of employing a photolithography method, an antireflection film is preferably formed over the insulating layer 202 prior to the photolithography process; accordingly, reflection of light on the conductive layer (e.g., the source electrode 130a, the drain electrode 130b) or the like of the transistor 160 in the light exposure by the photolithography method can be suppressed, i.e., a reduction of the resolution in the photolithography method can be suppressed. A material of the antireflection film can be selected as appropriate depending on a material of the resist and the like. Although dry etching is preferably employed as the etching, wet etching can alternatively be employed. An etching gas or an etchant thereof can be selected as appropriate depending on the material to be etched.

Figure 5C:
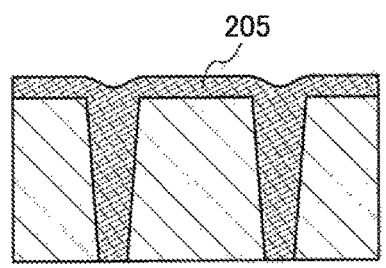
Figure 5D:
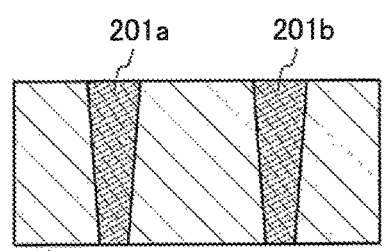

Next, a layer 205 containing a conductive material is formed at least to fill the openings 204a and 204b (see FIG. 5C). As the layer 205, a film containing a metal such as aluminum, titanium, tantalum, or tungsten, or a nitride or an alloy thereof, or the like can be used. A stacked-layer structure of the films can also be used as the layer 205. For example, a stacked layer of a titanium film, a titanium nitride film, and a tungsten film can be used as the layer 205. In particular, in the case where the wirings 200a and 200b contain copper, it is preferable to use a titanium nitride layer with a thickness greater than or equal to 5 nm and less than or equal to 50 nm as the layer 205 in order to prevent dispersion of copper to the transistor 160. As a method for forming the layer 205, a CVD method, a sputtering method, or the like can be employed.

Next, the layer 205 is removed at least to expose a top surface of the insulating layer 202 by CMP (see FIG. 5D), so that the contact plugs 201a and 201b are formed.

Figure 5E:
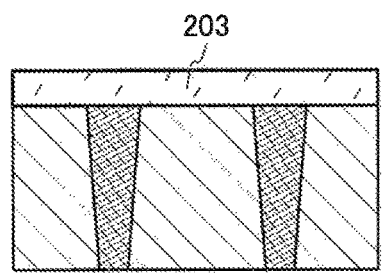

Next, the insulating layer 203 is formed over the insulating layer 202 and the contact plugs 201a and 201b (see FIG. 5E). As the insulating layer 203, a single-layer structure or a stacked-layer structure using a film containing an inorganic insulating material such as silicon oxide, silicon nitride oxide, or silicon nitride or a film using an insulating material such as silicone resin (so-called an SiOC film) formed from organosilane such as alkylsilane can be used. For example, a stacked layer of an SiOC film and a silicon oxide film can be used as the insulating layer 203. As a method for forming the insulating layer 203, a CVD method, a sputtering method, a spin coating method, or the like can be employed.

Figure 5F:
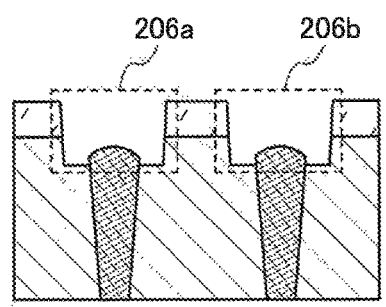

Next, a resist mask is formed over the insulating layer 203 by a photolithography method or the like, and at least the insulating layer 203 is etched using the resist mask, so that grooves 206a and 206b are formed (see FIG. 5F). The grooves 206a and 206b pass through at least the insulating layer 203 to reach the contact plugs 201a and 201b, respectively. For example, the process time is controlled such that the grooves 206a and 206b have an appropriate shape. Further, as described above, in the case of employing a photolithography method, an antireflection film is preferably formed over the insulating layer 203 prior to the photolithography process. It is preferable to employ dry etching (particularly reactive ion etching) as the etching.

Figure 5G:
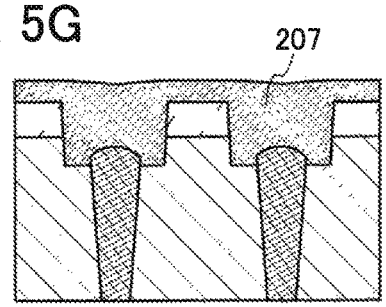
Figure 5H:
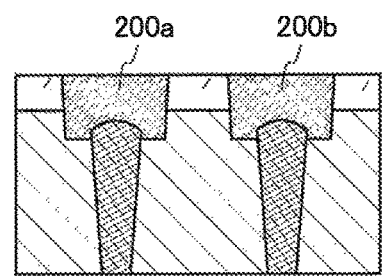

Next, a layer 207 containing a conductive material is formed at least to fill the grooves 206a and 206b (see FIG. 5G). As the layer 207, a film containing a metal such as copper, aluminum, titanium, tantalum, or tungsten, or a nitride or an alloy thereof, or the like can be used. A stacked-layer structure of the films can also be used as the layer 207. For example, a stacked layer of a titanium nitride film and a copper film can be used as the layer 207. As a method for forming the layer 207, a CVD method; a sputtering method; or a method in which a seed layer is formed by a CVD method, a sputtering method, or the like and electroplating is performed thereon; or the like can be employed.

As the layer 207, a wiring containing a film of copper or a copper alloy is preferably used; accordingly, the wiring resistance can be reduced. For example, the layer 207 can be formed in the following method: a tantalum nitride layer with a thickness of from 5 nm to 50 nm is formed by a CVD method and a first copper layer with a thickness of from 5 nm to 50 nm is formed by a sputtering method or the like; and an electroplating method is performed using the layers as an electrode, so that a second copper layer is stacked. In that case, the tantalum nitride layer functions to prevent dispersion of copper downwardly and improve the adhesion with the insulating layer 203, and the first copper layer serves as a seed of the second copper layer.

Next, the layer 207 is removed at least to expose a top surface of the insulating layer 203 by CMP (see FIG. 5H), so that the wirings 200a and 200b are formed.

Through the above, the wiring layer 20a is formed. The same process can be applied to the wiring layer 20b.

<Structure Example of Memory Cell 300>

An example of a structure of the memory cell 300 is described below using FIG. 6.

Figure 6:
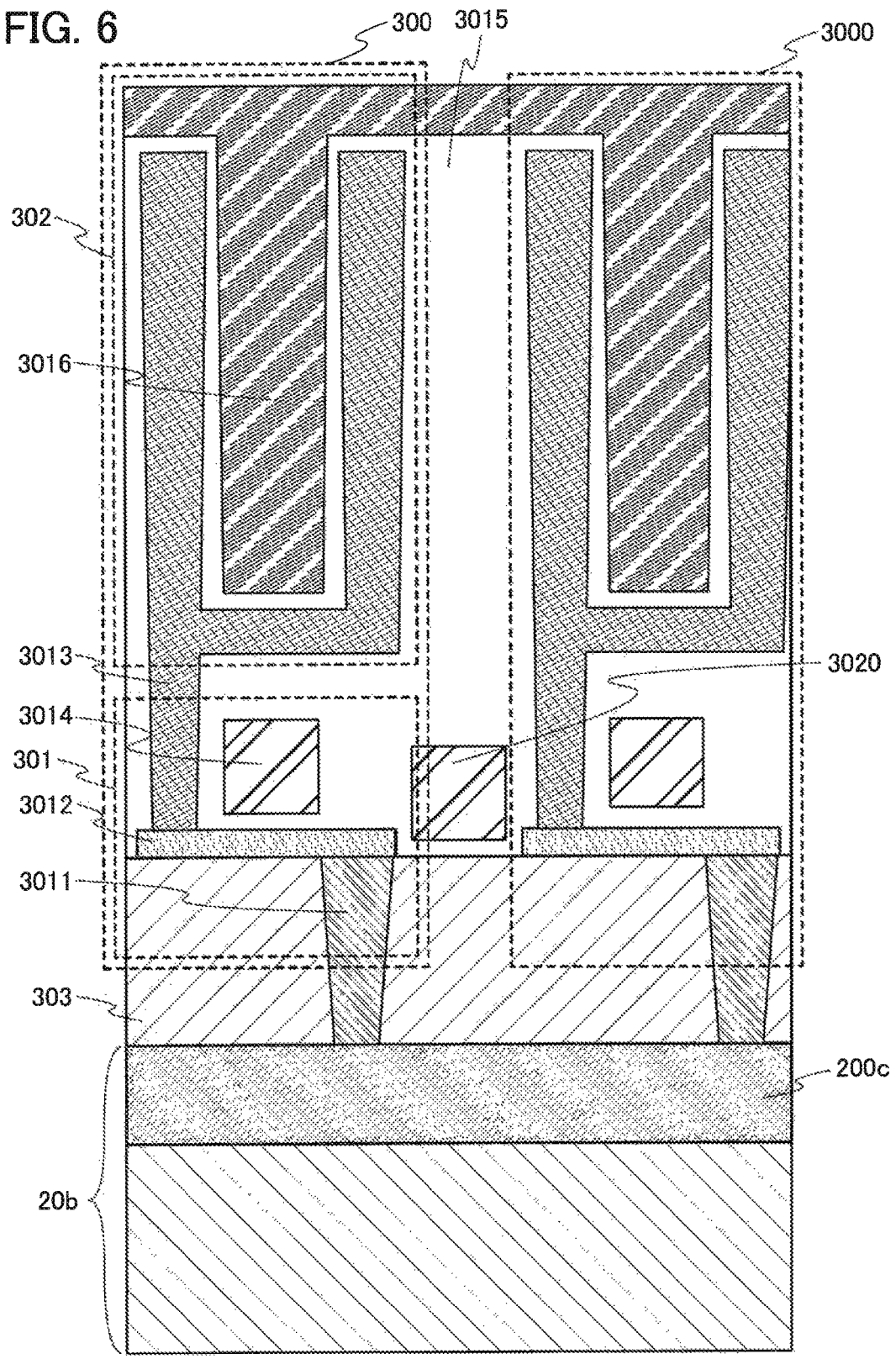
FIG. 6 illustrates a structure example of a memory cell.

The memory cell 300 shown in FIG. 6 includes the transistor 301 and the capacitor 302 one electrode of which is electrically connected to one of a source and a drain of the transistor 301. Further, the transistor 301 includes a pair of layers 3011 and 3013 containing conductive materials, which function as the source and the drain, a layer 3014 containing a conductive material, which functions as a gate, and an oxide semiconductor layer 3012 which includes a channel region. The capacitor 302 includes the layer 3013 which functions as one electrode and a layer 3016 containing a conductive material, which functions as the other electrode. An insulating layer 3015 is provided between the layer 3014 and the oxide semiconductor layer 3012, between the layer 3013 and the layer 3016, and the like.

The layer 3011 is provided in an opening of an insulating layer 303. The insulating layer 303 is an insulating layer provided over the wiring layer 20b shown in FIG. 1, and the layer 3011 is connected to a wiring 200c in the wiring layer 20b.

FIG. 6 also shows a memory cell 3000 which is next to the memory cell 300 and a layer 3020 containing a conductive material, which functions as a gate of a transistor included in a memory cell which is next to the memory cells 300 and 3000 in the direction perpendicular to the drawing. In FIG. 6, the layers 3014 and 3020 function as word lines in the memory cell array and the wiring 200c functions as a bit line.

<Example of Manufacturing Method of Memory Cell 300>

Next, an example of a method for manufacturing the memory cell 300 is described using FIGS. 7A to 7H.

Figure 7A:
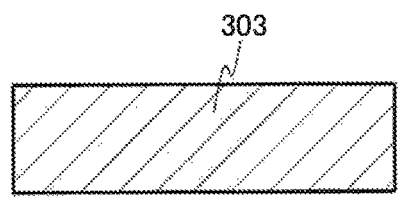
FIGS. 7A to 7H illustrate an example of a method for manufacturing a transistor in a memory cell.

First, the insulating layer 303 is formed over the wiring layer 20b (see FIG. 7A, though the wiring layer 20b is not shown). The insulating layer 303 can have a single-layer structure or a stacked-layer structure using a film containing an inorganic insulating material such as silicon oxide, silicon nitride oxide, silicon nitride, hafnium oxide, aluminum oxide, or tantalum oxide or an organic insulating material such as polyimide or acrylic. For example, a stacked layer of a silicon nitride film and a silicon oxide film can be used as the insulating layer 303. As a method for forming the insulating layer 303, a CVD method, a sputtering method, a spin coating method, or the like can be employed.

Next, a resist mask is formed over the insulating layer 303 by a photolithography method or the like, and the insulating layer 303 is etched using the resist mask, so that the openings are formed. In the case of employing a photolithography method, an antireflection film is preferably formed over the insulating layer 303 prior to the photolithography process as described above. Although dry etching is preferably employed as the etching, wet etching can alternatively be employed. An etching gas thereof can be selected as appropriate depending on the material to be etched.

Figure 7B:
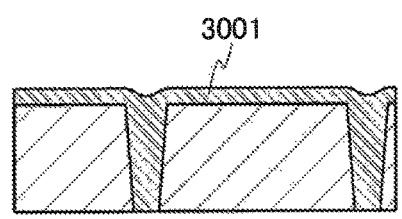
Figure 7C:
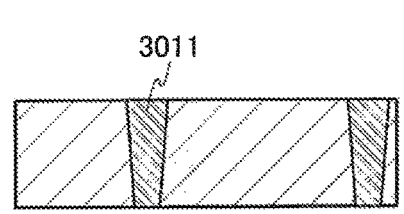

Next, a layer 3001 containing a conductive material is formed at least to fill the openings in the insulating layer 303 (see FIG. 7B). As the layer 3001, a film containing a metal such as aluminum, titanium, tantalum, or tungsten, or a nitride or an alloy thereof, or the like can be used. A stacked-layer structure of the films can be used as the layer 3001. As a method for forming the layer 3001, a CVD method, a sputtering method, or the like can be employed.

Next, the layer 3001 is removed at least to expose a top surface of the insulating layer 303 by CMP (see FIG. 7C), so that the layer 3011 containing a conductive material which functions as a source or a drain, and the like are formed.

Next, an oxide semiconductor layer is formed over the insulating layer 303 and the layer 3011. As an oxide semiconductor used for the oxide semiconductor layer, the following metal oxide can be used: a four-component metal oxide such as an In—Sn—Ga—Zn—O based oxide semiconductor; a three-component metal oxide such as an In—Ga—Zn—O based oxide semiconductor, an In—Sn—Zn—O based oxide semiconductor, an In—Al—Zn—O based oxide semiconductor, a Sn—Ga—Zn—O based oxide semiconductor, an Al—Ga—Zn—O based oxide semiconductor, or a Sn—Al—Zn—O based oxide semiconductor; a two-component metal oxide such as an In—Zn—O based oxide semiconductor, a Sn—Zn—O based oxide semiconductor, an Al—Zn—O based oxide semiconductor, a Zn—Mg—O based oxide semiconductor, a Sn—Mg—O based oxide semiconductor, an In—Mg—O based oxide semiconductor, or an In—Ga—O based oxide semiconductor; an one-component metal oxide such as an In—O based oxide semiconductor, a Sn—O based oxide semiconductor, or a Zn—O based oxide semiconductor; or the like. In this specification, for example, the "In—Sn—Ga—Zn—O-based oxide semiconductor" means a metal oxide containing indium (In), tin (Sn), gallium (Ga), and zinc (Zn), whose stoichiometric composition ratio is not particularly limited. The above oxide semiconductor may contain silicon.

The oxide semiconductor layer is preferably formed by a method in which impurities such as hydrogen, water, a hydroxyl group, or hydride do not enter the oxide semiconductor layer as much as possible. For example, the oxide semiconductor layer can be formed by a sputtering method or the like. A deposition atmosphere thereof may be a rare gas (typically argon) atmosphere, an oxygen atmosphere, or a mixed atmosphere containing a rare gas and oxygen; an atmosphere of a gas purified by sufficiently removing an impurity such as hydrogen, water, a hydroxyl group, or hydride is preferable, in order to prevent hydrogen, water, a hydroxyl group, hydride, or the like from entering the oxide semiconductor layer.

Although the oxide semiconductor layer may be amorphous, a crystalline oxide semiconductor layer is preferably used for the channel region of the transistor. This is because the reliability (resistance to the gate bias stress) of the transistor can be improved.

Although the crystalline oxide semiconductor layer is ideally in a single-crystal state, it is also preferable that the crystalline oxide semiconductor layer include a crystal with c-axis alignment (also referred to as c-axis aligned crystal (CAAC)). The crystal with c-axis alignment refers to a hexagonal crystal whose c-axis is perpendicular or substantially perpendicular to the surface where the crystal is provided (the top surface of the insulating layer 303 herein).

A sputtering method can be employed to form the oxide semiconductor layer including CAAC. In order to obtain the oxide semiconductor layer including CAAC by a sputtering method, it is important to form a hexagonal crystal in an initial stage of deposition of the oxide semiconductor layer and cause crystal growth from the hexagonal crystal as a seed; therefore, it is preferable that the distance between a target and the substrate be set to be longer (e.g., about 150 mm to about 200 mm) and the substrate heating temperature be 100° C. to 500° C., further preferably 200° C. to 400° C., still further preferably 250° C. to 300° C. In addition to that, the deposited oxide semiconductor layer is preferably subjected to heat treatment at a temperature higher than the substrate heating temperature, whereby microdefects in the film and defects at the interface with a stacked layer can be repaired.

The oxide semiconductor layer including CAAC is highly purified, in which defects due to oxygen deficiency are reduced, and the oxide semiconductor layer includes a c-axis crystal alignment, whereby valence electrons can be easily controlled to have low p-type conductivity.

Figure 7D:
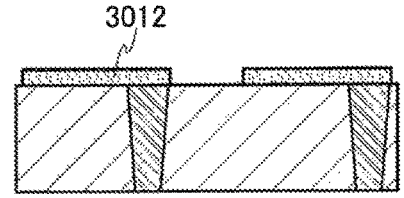

Next, a resist mask is formed by a photolithography method or the like, and the oxide semiconductor layer is etched using the resist mask, so that the oxide semiconductor layer 3012 and the like are formed (see FIG. 7D). Dry etching is preferably employed as the etching. An etching gas or an etchant thereof can be selected as appropriate depending on the material to be etched.

After that, heat treatment may be performed on the oxide semiconductor layer 3012. With the heat treatment, substances including hydrogen atoms in the oxide semiconductor layer 3012 can be further removed thus, a structure of the oxide semiconductor layer 3012 can be ordered and defect levels in the energy gap can be reduced. The heat treatment is performed under an inert gas atmosphere at a temperature greater than or equal to 250° C. and less than or equal to 700° C., preferably greater than or equal to 450° C. and less than or equal to 600° C. or less than a strain point of the substrate. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is set to be greater than or equal to 6 N (99.9999%), preferably greater than or equal to 7 N (99.99999%) (that is, the concentration of impurities is less than or equal to 1 ppm, preferably less than or equal to 0.1 ppm).

The impurities can be reduced by the heat treatment, leading to an i-type oxide semiconductor film (an intrinsic oxide semiconductor film) or a substantially i-type oxide semiconductor film, which enables a transistor having extremely high characteristics to be formed.

Figure 7E:
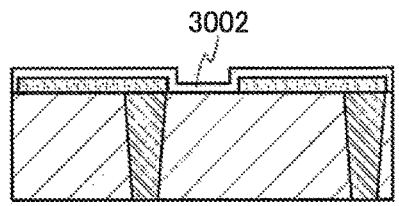

Next, an insulating layer 3002 is formed over the insulating layer 303 and the oxide semiconductor layer 3012 (see FIG. 7E). The insulating layer 3002 functions as a gate insulating film of the transistor 301. The insulating layer 3002 can have a single-layer structure or a stacked-layer structure using a film containing an inorganic insulating material such as silicon oxide, silicon oxynitride, hafnium oxide, aluminum oxide, or tantalum oxide. As a method for forming the insulating layer 3002, a sputtering method or the like can be employed.

Next, a layer containing a conductive material is formed over the insulating layer 3002. As the layer, a film containing a metal such as aluminum, titanium, tantalum, or tungsten, or a nitride or an alloy thereof, or the like can be used. An oxide such as indium oxide, tungsten oxide, or molybdenum oxide, or a nitride such as indium nitride or zinc nitride can also be used. Further, a stacked-layer structure of the films can also be used as the layer. As a method for forming the layer, a CVD method, a sputtering method, or the like can be employed.

Figure 7F:
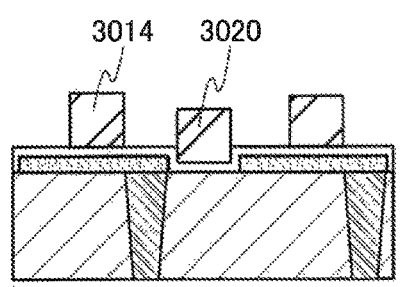

Next, a resist mask is formed over the layer containing a conductive material by a photolithography method or the like, and the layer is etched using the resist mask, so that the layers 3014 and 3020 containing conductive materials and the like are formed (see FIG. 7F). Although dry etching is preferably employed as the etching, wet etching can alternatively be employed. An etching gas or an etchant thereof can be selected as appropriate depending on the material to be etched.

Next, an insulating layer 3003 is formed over the insulating layer 3002 and the layers 3014 and 3020. The insulating layer 3003 can have a single-layer structure or a stacked-layer structure using a film containing an inorganic insulating material such as silicon oxide, silicon nitride oxide, or silicon nitride or an organic insulating material such as polyimide or acrylic. As a method for forming the insulating layer 3003, a CVD method, a sputtering method, a spin coating method, or the like can be employed.

Next, a resist mask is formed over the insulating layer 3003 by a photolithography method or the like, and the insulating layer 3003 is etched using the resist mask, so that openings are formed. Although thy etching is preferably employed as the etching, wet etching can alternatively be employed. An etching gas or an etchant thereof can be selected as appropriate depending on the material to be etched.

Figure 7G:
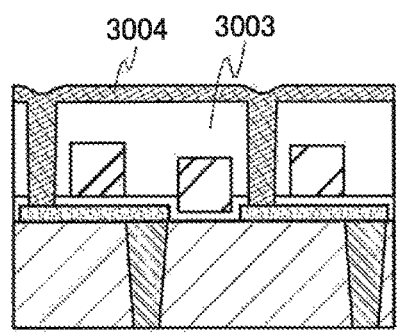
Figure 7H:
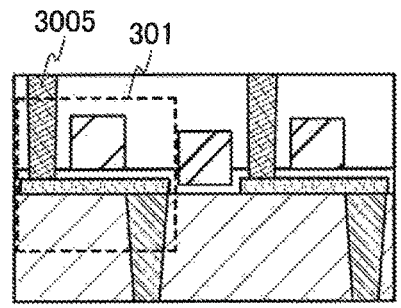

Next, a layer 3004 containing a conductive material is formed at least to fill the openings in the insulating layer 3003 (see FIG. 7G). As the layer 3004, a film containing a metal such as aluminum, titanium, tantalum, or tungsten, or a nitride or an alloy thereof, or the like can be used. A stacked-layer structure of the films can also be used as the layer 3004. As a method for forming the layer 3004, a CVD method, a sputtering method, or the like can be employed.

Next, the layer 3004 is removed at least to expose a top surface of the insulating layer 3003 by CMP (see FIG. 7H), so that a layer 3005 containing a conductive material which functions as a source or a drain of the memory cell 300, and the like are formed.

Through the above, the transistor 301 included in the memory cell 300 is formed. The capacitor (stack capacitor) 302 in the memory cell 300 can be formed as appropriate by a known method.

<Semiconductor Memory Device Disclosed in This Specification>

A semiconductor memory device disclosed in this specification includes a driver circuit including part of a substrate containing a single crystal semiconductor material, a multilayer wiring layer provided over the driver circuit, and a memory cell array layer provided over the multilayer wiring layer. That is, the driver circuit overlaps with the memory cell array in the semiconductor memory device disclosed in this specification. Accordingly, the integration degree of the semiconductor memory device can be increased as compared to the case where a driver circuit and a memory cell array are provided in the same plane using a substrate containing a single crystal semiconductor material.

As a wiring contained in the multilayer wiring layer, a wiring of copper or a copper alloy is preferably used; accordingly, the wiring resistance of the wiring can be reduced, i.e., an operation delay of the semiconductor memory device can be suppressed. This effect is particularly large in the case where a wiring of copper or a copper alloy is used as a wiring (so-called a bit line) used for data writing and data reading to/from a memory cell.

Further, a transistor whose channel region is formed of an oxide semiconductor is preferably used as a transistor included in the memory cell, This is because the off-state current of a transistor whose channel region is formed of a semiconductor having a wide band gap, such as an oxide semiconductor, is extremely small as compared to the off-state current of a transistor using another semiconductor such as silicon. Accordingly, the leakage of electrical charge from a capacitor can be suppressed in the memory cell in the semiconductor memory device disclosed in this specification. Consequently, the frequency of a refresh operation can be reduced. In this manner, power consumption can be reduced by reducing the frequency of a refresh operation in the semiconductor memory device disclosed in this specification.

Further, a stack capacitor is preferably used as the capacitor in the memory cell; accordingly, both of high capacitance and high integration of the memory cell can be achieved. Moreover, the semiconductor memory device disclosed in this specification is preferable in the following point as compared to a conventional semiconductor memory device in which each memory cell includes a stack capacitor or a trench capacitor. The conventional semiconductor memory device refers to a semiconductor memory device in which a transistor included in the memory cell is provided using a substrate containing a single crystal semiconductor material and a multilayer wiring layer is provided over the memory cell.

The semiconductor memory device disclosed in this specification is preferable in that a bit line is next to neither a pair of electrodes of the stack capacitor nor a word line. This is because in the memory cell array of the semiconductor memory device disclosed in this specification, the word line (e.g., the layer 3014, 3020 containing a conductive material) and the pair of electrodes (e.g., the layers 3013 and 3016 containing conductive materials) of the capacitor are provided on a side which is opposite to the bit line (the wiring 200c) with respect to the transistor 301, whereas in the conventional semiconductor memory device, a bit line and at least one of a pair of electrodes of a capacitor and a word line are provided on the same side of the transistor in the memory cell. Accordingly, in the semiconductor memory device disclosed in this specification, power consumption can be reduced and an operation delay can be suppressed by reducing the parasitic capacitance of each wiring (particularly the bit line), for example.

In addition, the structure where the capacitor 302 and the wiring 200c are provided with the transistor 301 provided therebetween leads to an increase in the freedom of design of the capacitor 302 and the wiring 200c, which enables a capacitor with an appropriate capacitance to be formed in an area as small as possible.

<Application Example of Semiconductor Memory Device>
An application example of the above-described semiconductor memory device is described below using FIG. 8.

Figure 8:
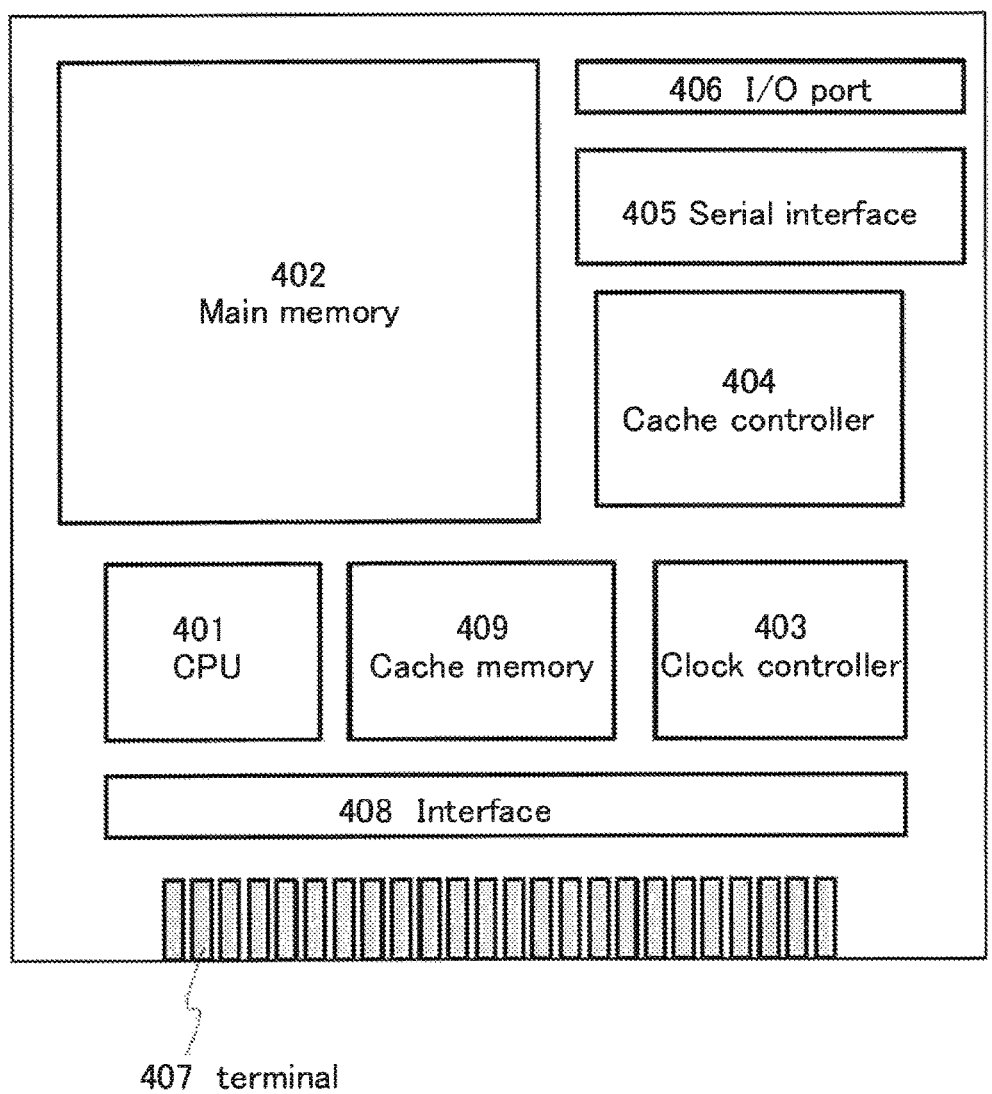
FIG. 8 is a block diagram illustrating a structure example of a microprocessor.

FIG. 8 is a block diagram showing a structure example of a microprocessor. The microprocessor illustrated in FIG. 8 includes a CPU 401, a main memory 402, a clock controller 403, a cache controller 404, a serial interface 405, an I/O port 406, terminals 407, an interface 408, a cache memory 409, and the like. It is needless to say that the microprocessor illustrated in FIG. 8 is just an example of the simplified structure, and practical microprocessors have various structures depending on their usages.

In order to operate the CPU 401 at high speed, a high-speed memory matched for the speed of the CPU 401 is needed. However, a high-speed large capacity memory whose access time is matched for the operation speed of the CPU 401 generally costs high. Thus, in addition to the main memory 402 having large capacity, the cache memory 409 which is a high-speed memory having smaller capacity than the main memory 402, such as an SRAM, is provided between the CPU 401 and the main memory 402. The CPU 401 accesses the cache memory 409, thereby operating at high speed regardless of the speed of the main memory 402.

In the microprocessor illustrated in FIG. 8, the above-described semiconductor memory device can be used for the main memory 402. According to the above structure, a highly integrated, highly reliable microprocessor can be provided.

A program to be executed in the CPU 401 is stored in the main memory 402. The program stored in the main memory 402 is downloaded to the cache memory 409 in the initial execution, for example. Not only the program stored in the main memory 402 but also a program in any external memory can be downloaded. The cache memory 409 not only stores the program executed in the CPU but also functions as a work region and temporarily stores the calculation results or the like of the CPU 401.

The number of CPUs is not limited to one; a plurality of CPUs may be provided. By processing in parallel with a plurality of CPUs, the operation speed can be improved. In that case, if the processing speeds of the CPUs are uneven, malfunction may occur in some cases as a whole processing; hence, the processing speed of each CPU which is a slave may be balanced by the rest of the CPUs which is/are a master/masters.

Although the microprocessor is given as an example herein, the usage of the above-described semiconductor memory device is not limited to the main memory of the microprocessor. For example, the above-described semiconductor memory device is also preferably used as a video RAM which is used in a driver circuit of a display device or a large capacity memory which is involved in an image processing circuit. Besides, also in a variety of system LSIs, the above-described semiconductor memory device can be used as a large capacity memory or a small-sized memory.

EXAMPLE 1

Examples of a semiconductor device having the above-described semiconductor memory device are described in this example. The semiconductor memory device according to one embodiment of the present invention leads to a reduction in the size of the semiconductor device. In particular, in the case of a portable semiconductor device, an advantage in improving convenience of users can be provided through the downsizing with the semiconductor memory device according to one embodiment of the present invention.

Figure 9A:
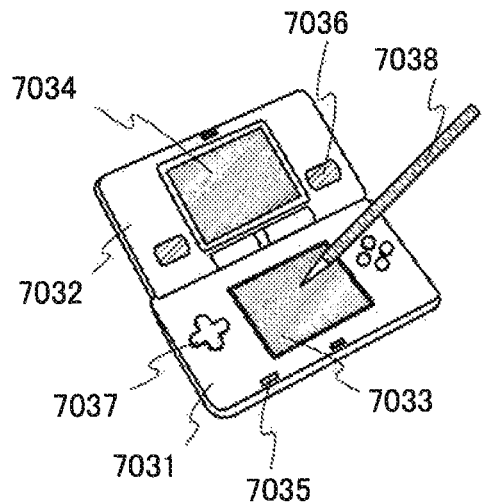
FIGS. 9A to 9C illustrate concrete examples of a semiconductor device.
Figure 9B:
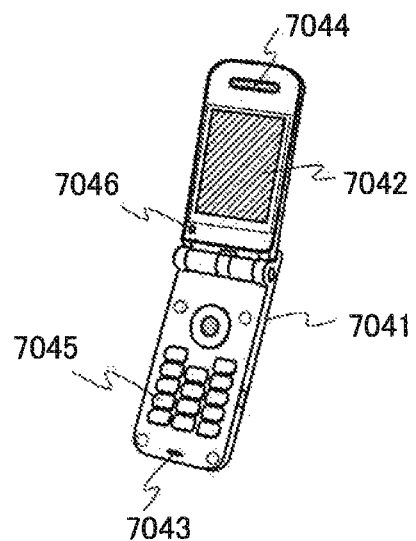
Figure 9C:
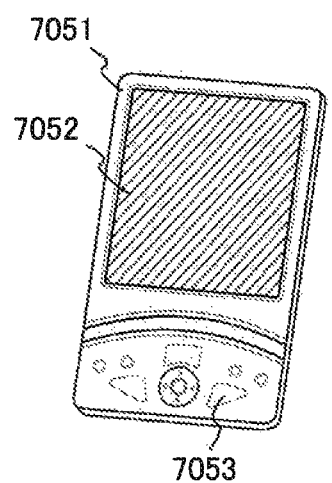

The semiconductor memory device according to one embodiment of the present invention can be used for display devices, laptops, or image reproducing devices provided with recording media (typically, devices which reproduce the content of recording media such as digital versatile discs (DVDs) and have displays for displaying the reproduced images). Other than the above, as examples of the semiconductor device to which the semiconductor memory device according to one embodiment of the present invention can be applied, mobile phones, portable game machines, portable information terminals, e-book readers, cameras such as video cameras or digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 9A to 9C illustrate concrete examples of the semiconductor devices.

FIG. 9A illustrates a portable game machine including a housing 7031, a housing 7032, a display portion 7033, a display portion 7034, a microphone 7035, speakers 7036, an operation key 7037, a stylus 7038, and the like. The semiconductor memory device according to one embodiment of the present invention can be applied to an integrated circuit for controlling driving of the portable game machine. With the use of the semiconductor memory device according to one embodiment of the present invention for the integrated circuit for controlling driving of the portable game machine, a compact portable game machine can be provided. Although the portable game machine illustrated in FIG. 9A has two display portions, 7033 and 7034, the number of display portions included in the portable game machine is not limited to two.

FIG. 9B illustrates a mobile phone including a housing 7041, a display portion 7042, an audio-input portion 7043, an audio-output portion 7044, operation keys 7045, a light-receiving portion 7046, and the like. Light received in the light-receiving portion 7046 is converted into electrical signals, whereby external images can be loaded. The semiconductor memory device according to one embodiment of the present invention can be applied to an integrated circuit for controlling driving of the mobile phone. With the use of the semiconductor memory device according to one embodiment of the present invention for the integrated circuit for controlling driving of the mobile phone, a compact mobile phone can be provided.

FIG. 9C illustrates a portable information terminal including a housing 7051, a display portion 7052, operation keys 7053, and the like. In the portable information terminal illustrated in FIG. 9C, a modem may be incorporated in the housing 7051. The semiconductor memory device according to one embodiment of the present invention can be applied to an integrated circuit for controlling driving of the portable information terminal. With the use of the semiconductor memory device according to one embodiment of the present invention for the integrated circuit for controlling driving of the portable information terminal, a compact portable information terminal can be provided.

This application is based on Japanese Patent Application serial no. 2011-005401 filed with Japan Patent Office on Jan. 14, 2011, the entire contents of which are hereby incorporated by reference.

What is claimed is:

1. A semiconductor memory device comprising:
a driver circuit; and
a memory cell over the driver circuit, the memory cell comprising:
a transistor; and
a capacitor over the transistor, the capacitor comprising:
a first layer comprising a first conductive material, the first layer electrically connected to one of a source and a drain of the transistor; and
a second layer over the first layer, the second layer comprising a second conductive material,
wherein the first layer has a concave shape,
wherein the first layer comprises a first portion and a second portion,
wherein the second layer comprises a portion,
wherein the portion of the second layer overlaps with the first portion of the first layer,
wherein a bottom surface of the portion of the second layer is below a top surface of the second portion of the first layer, and
wherein the memory cell is electrically connected to the driver circuit.

2. The semiconductor memory device according to claim 1, wherein the memory cell overlaps with the driver circuit.

3. The semiconductor memory device according to claim 1, wherein a channel region of the transistor comprises an oxide semiconductor material.

4. The semiconductor memory device according to claim 1, wherein the capacitor and a channel region of the transistor overlap with each other.

5. The semiconductor memory device according to claim 1, wherein the semiconductor memory device is a DRAM memory device.

6. The semiconductor memory device according to claim 1, wherein the driver circuit comprises a transistor comprising a channel region formed in a single crystal semiconductor substrate.

7. A driver circuit of a display device comprising the semiconductor memory device according to claim 1 as a video RAM.

8. A microprocessor comprising the semiconductor memory device according to claim 1 as a main memory.

9. A semiconductor memory device comprising:
a driver circuit;
a multilayer wiring layer over the driver circuit, the multilayer wiring layer comprising a wiring; and
a memory cell over the multilayer wiring layer, the memory cell comprising:
a transistor; and
a capacitor over the transistor, the capacitor comprising:
a first layer comprising a first conductive material, the first layer electrically connected to one of a source and a drain of the transistor; and
a second layer over the first layer, the second layer comprising a second conductive material,
wherein the first layer has a concave shape,
wherein the first layer comprises a first portion and a second portion,
wherein the second layer comprises a portion,
wherein the portion of the second layer overlaps with the first portion of the first layer,
wherein a bottom surface of the portion of the second layer is below a top surface of the second portion of the first layer, and
wherein the memory cell is electrically connected to the driver circuit through the wiring.

10. The semiconductor memory device according to claim 9, wherein the memory cell overlaps with the driver circuit.

11. The semiconductor memory device according to claim 9, wherein a channel region of the transistor comprises an oxide semiconductor material.

12. The semiconductor memory device according to claim 9, wherein the capacitor and a channel region of the transistor overlap with each other.

13. The semiconductor memory device according to claim 9, wherein the semiconductor memory device is a DRAM memory device.

14. The semiconductor memory device according to claim 9, wherein the driver circuit comprises a transistor comprising a channel region formed in a single crystal semiconductor substrate.

15. A driver circuit of a display device comprising the semiconductor memory device according to claim 9 as a video RAM.

16. A microprocessor comprising the semiconductor memory device according to claim 9 as a main memory.

17. A semiconductor memory device comprising:
a driver circuit;
a multilayer wiring layer over the driver circuit, the multilayer wiring layer comprising a wiring which comprises copper; and
a memory cell over the multilayer wiring layer, the memory cell comprising:
a transistor; and
a capacitor over the transistor, the capacitor comprising:
a first layer comprising a first conductive material, the first layer electrically connected to one of a source and a drain of the transistor; and
a second layer over the first layer, the second layer comprising a second conductive material,
wherein the first layer has a concave shape,
wherein the first layer comprises a first portion and a second portion,
wherein the second layer comprises a portion,
wherein the portion of the second layer overlaps with the first portion of the first layer,
wherein a bottom surface of the portion of the second layer is below a top surface of the second portion of the first layer,
wherein the memory cell is electrically connected to the driver circuit through the wiring.

18. The semiconductor memory device according to claim 17, wherein the memory cell overlaps with the driver circuit.

19. The semiconductor memory device according to claim 17, wherein a channel region of the transistor comprises an oxide semiconductor material.

20. The semiconductor memory device according to claim 17, wherein the capacitor and a channel region of the transistor overlap with each other.

21. The semiconductor memory device according to claim 17, wherein the semiconductor memory device is a DRAM memory device.

22. The semiconductor memory device according to claim 17, wherein the driver circuit comprises a transistor comprising a channel region formed in a single crystal semiconductor substrate.

23. A driver circuit of a display device comprising the semiconductor memory device according to claim 17 as a video RAM.

24. A microprocessor comprising the semiconductor memory device according to claim 17 as a main memory.

* * * * *